United States Patent
Peleato-Inarrea et al.

(10) Patent No.: US 9,294,132 B1
(45) Date of Patent: Mar. 22, 2016

(54) DUAL-STAGE DATA DECODING FOR NON-VOLATILE MEMORIES

(71) Applicants: Borja Peleato-Inarrea, Menlo Park, CA (US); Andrei Vityaev, San Jose, CA (US); Nenad Miladinovic, Campbell, CA (US)

(72) Inventors: Borja Peleato-Inarrea, Menlo Park, CA (US); Andrei Vityaev, San Jose, CA (US); Nenad Miladinovic, Campbell, CA (US)

(73) Assignee: Proton Digital Systems, Inc., San Jose, CA (US)

( * ) Notice: Subject to any disclaimer, the term of this patent is extended or adjusted under 35 U.S.C. 154(b) by 353 days.

(21) Appl. No.: 13/672,047

(22) Filed: Nov. 8, 2012

Related U.S. Application Data

(60) Provisional application No. 61/562,182, filed on Nov. 21, 2011.

(51) Int. Cl.
| | |
|---|---|
| *H03M 13/29* | (2006.01) |
| *G11B 20/18* | (2006.01) |
| *H03M 13/39* | (2006.01) |
| *G06F 11/10* | (2006.01) |
| *H03M 13/27* | (2006.01) |

(52) U.S. Cl.
CPC ........... *H03M 13/29* (2013.01); *G06F 11/1068* (2013.01); *G11B 20/1833* (2013.01); *H03M 13/3927* (2013.01); *G11B 2020/185* (2013.01); *G11B 2020/1846* (2013.01); *H03M 13/27* (2013.01)

(58) Field of Classification Search
CPC ............ G06F 11/1008; G06F 11/1076; G06F 11/1068; G06F 11/1044; G06F 11/1056; G06F 11/106; G11C 7/1006; G11B 20/1833; H03M 13/29; H03M 13/112; H03M 13/1108; H03M 13/1111
USPC .......................................... 714/763, 764, 755
See application file for complete search history.

(56) References Cited

U.S. PATENT DOCUMENTS

| | | | | |
|---|---|---|---|---|
| 7,304,893 | B1 * | 12/2007 | Hemink | 365/185.22 |
| 7,809,994 | B2 | 10/2010 | Gorobets | |
| 7,840,875 | B2 | 11/2010 | Conley | |
| 7,877,665 | B2 | 1/2011 | Mokhlesi | |
| 8,429,498 | B1 * | 4/2013 | Anholt et al. | 714/764 |
| 8,689,074 | B1 * | 4/2014 | Tai | 714/752 |
| 2003/0065989 | A1 * | 4/2003 | Yedida et al. | 714/703 |
| 2007/0061687 | A1 * | 3/2007 | Hwang | 714/780 |
| 2010/0199149 | A1 * | 8/2010 | Weingarten et al. | 714/773 |
| 2012/0240007 | A1 * | 9/2012 | Barndt et al. | 714/758 |
| 2013/0080857 | A1 * | 3/2013 | Lee et al. | 714/773 |
| 2013/0139035 | A1 * | 5/2013 | Zhong et al. | 714/773 |

OTHER PUBLICATIONS

Jinghu Chen, Ajay Dholakia, Evangelos Eleftheriou, Marc P.C Fossorier and Xiao-Yu Hu "Reduced Complexity Decoding of LDPC Codes", IEEE Transactions on Communications, vol. 53, No. 8, Aug. 2005.

(Continued)

*Primary Examiner* — Albert Decady
*Assistant Examiner* — Osman M Alshack
(74) *Attorney, Agent, or Firm* — Bardmesser Law Group

(57) ABSTRACT

A method and system for decoding information read from a non-volatile memory uses a two stage decoding algorithm, where the first stage is a high-speed, low precision decoder and the second stage is a low-speed, high precision decoder. Most of the time only the first stage of the decoder is used, which lowers the average power consumption of the decoding process.

15 Claims, 6 Drawing Sheets

(56) References Cited

OTHER PUBLICATIONS

K. Gunnam, G.Choi, M. Yeary, "A Parallel VLSI Architecture for Layered Decoding for Array LDPC Codes," VLSI Design, 2007. 6th International Conference on Embedded Systems, Jan. 2007 pp. 738-743.

Gunnam, Kiran K., et al., "VLSI Architectures for Layered Decoding for Irregular LDPC Codes of WiMax", IEEE Communications, pp. 4542-4547, 2007.

XXiao-Yu Hu, Eleftheriou, E., Arnold, D.-M., Dholakia, A. "Efficient implementations of the sum-product algorithm for decoding LDPC codes," Global Telecommunications Conference, Nov. 2001.

T. Richardson and R. Urbanke, "The capacity of low-density parity-check codes under message-passing decoding", IEEE Transactions in Information Theory, vol. 47, pp. 599-618, 2001.

Thomas J. Richardson and Rüdiger L. Urbanke, "Efficient Encoding of Low-Density Parity-Check Codes," IEEE Transactions in Information Theory, 47(2), Feb. 2001.

K. Gunnam, C. Gwan, M. Yeary, "An LDPC decoding schedule for memory access reduction," Acoustics, Speech, and Signal Processing, 2004. Proceedings. (ICASSP '04). IEEE International Conference on vol. 5, May 17-21, 2004 pp. V-173-6 vol. 5.

K. Gunnam, G. Choi, W. Wang, E. Kim, M. Yeary, "Decoding of Quasi-cyclic LDPC Codes Using an On-the-Fly Computation," Signals, Systems and Computers, 2006. ACSSC '06. Fortieth Asilomar Conference on Oct.-Nov. 2006 pp. 1192-1199.

M. Mitzenmacher, "A note on low density parity check codes for erasures and errors", SRC Technical Note 1998-017, Dec. 1998.

\* cited by examiner

DUAL-STAGE DATA DECODING FOR NON-VOLATILE MEMORIES

CROSS-REFERENCE TO RELATED APPLICATIONS

This application is a non-provisional application of U.S. Provisional Patent Application No. 61/562,182, filed Nov. 21, 2011, which is incorporated by reference herein in its entirety.

FIELD OF THE INVENTION

The invention relates to the non-volatile memory controller technology, and more particularly, to information retrieval through error correction during the read process from such memory.

BACKGROUND OF THE INVENTION

The main challenges of NAND Flash and other types of non-volatile memories are their higher cost relative to Hard-Disk-Drive memories, slow write time, limited endurance (defined as the maximum number of Program/Erase cycles) and limited high temperature data retention time. Furthermore, in order to improve cost parameters, one must use higher-density (more bits per cell) NAND Flash, which in turn degrades its endurance and data retention.

Manufacturers have addressed the endurance and data retention challenges by introducing codes with higher error-correction capability to protect the data. A higher error correction capability directly translates into an increase in endurance, since the memory can withstand more wear, while still allowing for the information to be retrieved. However, increasing the error correction capability of the code requires increasing the computational complexity of the decoder, resulting in a reduction of the read throughput and a significant increase in power consumption.

The invention described here is a novel information decoding scheme which lowers the power consumed by the decoder. The invention provides a more efficient decoding of the noisy read values, regardless of where the noise comes from. The disturbance mechanisms addressed by this invention include inter-cell interference, read disturbance, erratic over-programming, high temperature retention loss, low temperature retention loss, high number of Program/Erase (P/E) cycles, coarse (faster) write and coarse (faster) read operations.

SUMMARY OF THE INVENTION

The basic unit for read and write operations in NAND flash memories is called a page. Each page in a flash memory block is encoded independently with an error-correcting code, so that they can be efficiently decoded as they are being read.

Before a page can be written, it needs to be erased. The basic unit for erase operations in flash memories is called a block. A block represents a group of multiple adjacent pages that must be erased simultaneously. Some blocks may suffer higher noise levels than others, which is primarily related to the number of times that they have been written and erased. Furthermore, different pages within a block may suffer different noise levels. The decoder, in charge of correcting the errors introduced by the noise, is generally chosen so that it can correct the worst case expected, but most of the pages decoded throughout the lifetime of the device suffer significantly less noise than the worst case. The decoder therefore processes a significant number of pages which could be decoded using a weaker but more efficient decoder.

The present invention includes a decoding scheme with two separate decoders: a simple decoder which prioritizes efficiency over correction capability and a backup decoder which prioritizes correction capability over efficiency. The simple decoder corrects pages with low BER (Bit Error Rate) and the backup decoder attempts to correct the pages which cannot be corrected with the simple decoder.

Most of the pages decoded during the memory lifetime have low BER. It is only after the device has suffered significant wear that the BER starts to increase for some pages, until it eventually becomes too high for the memory to store information reliably, and the device is considered dead. The simple decoder is able to correctly decode most of the pages read during the beginning of the device's lifetime. It is only towards the end of lifetime (close to the maximum number of P/E cycles) that the backup decoder starts being used. The proposed scheme provides the same correction capability, and therefore the same device endurance, as a system using only the backup decoder, but is significantly more power-efficient on average. The only drawbacks of this scheme are the need for implementing two decoders and the computational overhead derived from making two decoding attempts when the simple decoder fails to correct the errors. However, this computational overhead is relatively small, and the more efficient decoding of the cases in which the simple decoder succeeds more than compensates for that overhead.

In one embodiment, a memory system with error correction includes a flash memory organized into blocks and having a controller that keeps track of P/E cycles for each block of the flash memory. A read/write channel encoder/decoder stores error correction code data. A read channel decoder includes two decoders, a high-speed low-precision decoder and a low-speed high-precision decoder. The high-speed low-precision decoder is used for low P/E cycles (e.g., up to about 60%-70% of the manufacturer's P/E cycle rating), and the low-speed high-precision decoder is used for high P/E cycles (e.g., above about 60%-70% of the manufacturer's P/E cycle rating) on a block-by-block basis. The high-speed low-precision decoder can be an LDPC erasure decoder, or a bit-flipping LDPC decoders using either Gallager algorithm A or B. The low-speed high-precision decoder can be a Min-Sum LDPC Decoder, a Belief Propagation Decoder, an Offset Decoder, or a Normalized Min-Sum Decoder.

In another embodiment, a memory system with error correction includes a flash memory having row and columns and organized into a plurality of pages, with multiple pages organized into blocks. A controller keeps track of P/E cycles for each block and provides stored data bits for each memory cell and a representation of cell voltage used to produce each of the stored data bits. A read/write channel encoder/decoder stores error correction code data. The read/write channel encoder/decoder includes (a) a high-speed low-precision decoder used for error correction when the cell voltage is not substantially different from a programmed voltage of the memory cell, and (b) a low-speed high-precision decoder used for error correction when the cell voltage is substantially different from the programmed voltage of the memory cell. Substantially different means 10-20% variation from the programmed voltage value. The high-speed low-precision decoder or the low-speed high-precision decoder is used on a block-by-block basis.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the present invention.

Figure 1:
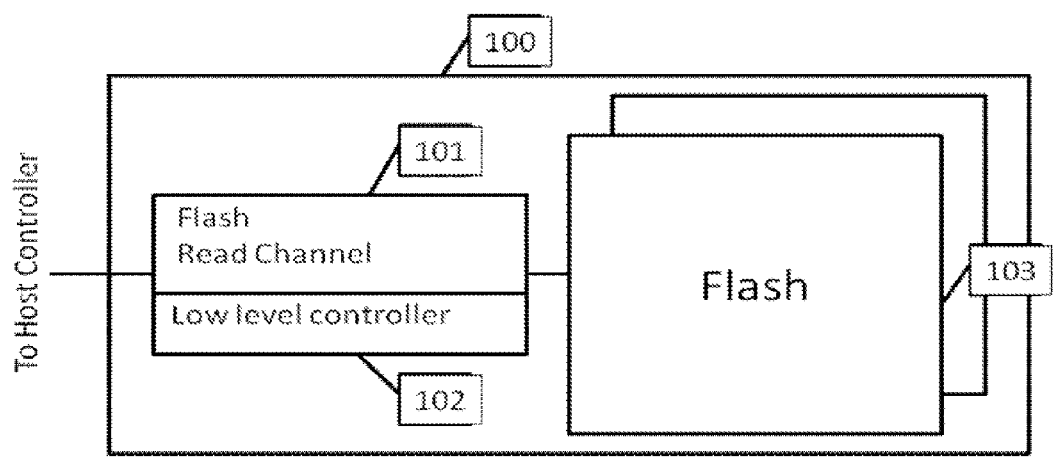
FIG. 1 shows a diagram of an embedded memory package incorporating a flash controller integrated circuit (IC) and a plurality of flash chips.

FIG. 1 shows a managed memory, that includes a flash memory die 103 and a single Flash Controller silicon die with two distinct areas 101 (Flash Read Channel) and 102 (actual Flash Controller). Each block in the flash memory die is divided into pages, and each page is independently encoded and decoded.

Figure 2:
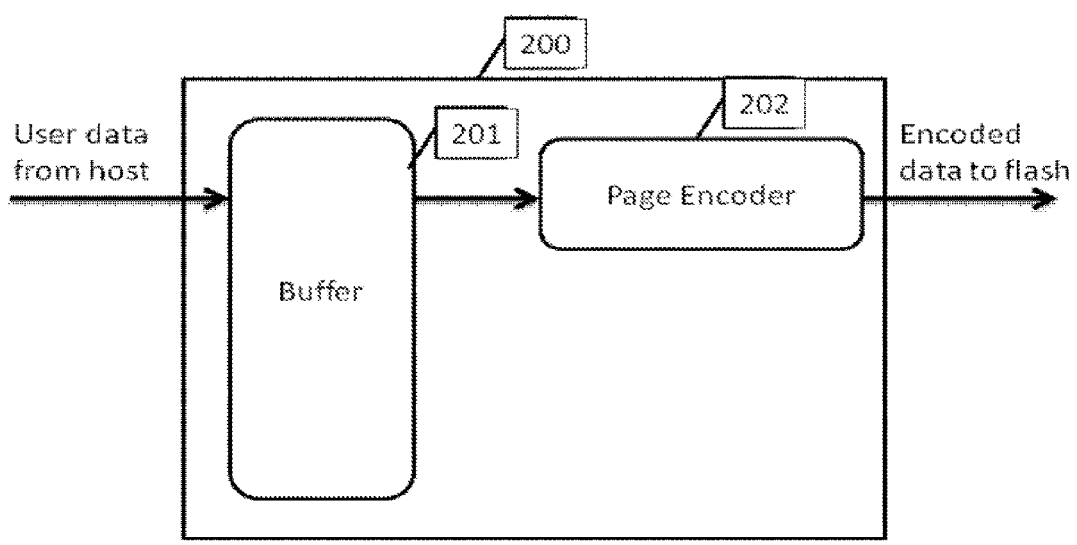
FIG. 2 shows a block diagram of a flash read channel in FIG. 1.
Figure 3:
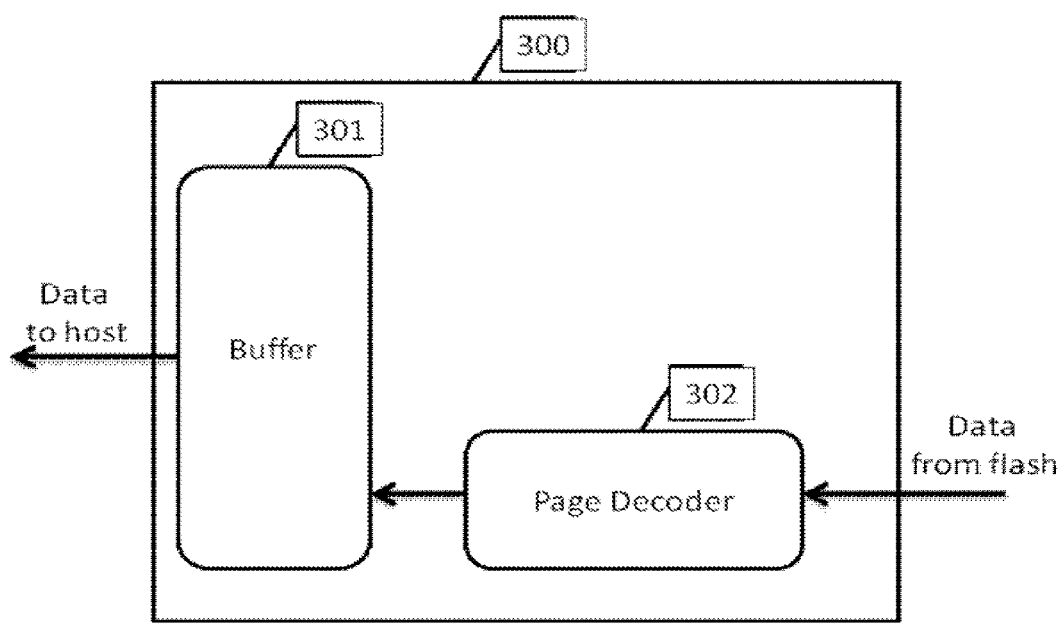
FIG. 3 shows a block diagram of the flash read channel in FIG. 1.

FIG. 2 shows a block diagram of the flash read channel 101 acting as encoder. When the host sends new information to be written on the flash memory, the controller 102 temporarily stores the incoming bits in a random access memory buffer 201 before encoding them and writing the codewords on the flash. FIG. 3 shows a block diagram of the flash read channel 101 acting as decoder. When the host requests information from the flash memory, the controller 102 reads the corresponding pages and passes the read values to the decoder 302. The decoder 302 translates the read values into bits, attempting to correct any errors that might have occurred. The bits can then be stored in the buffer 201 before they are sent to the user.

Figure 4:
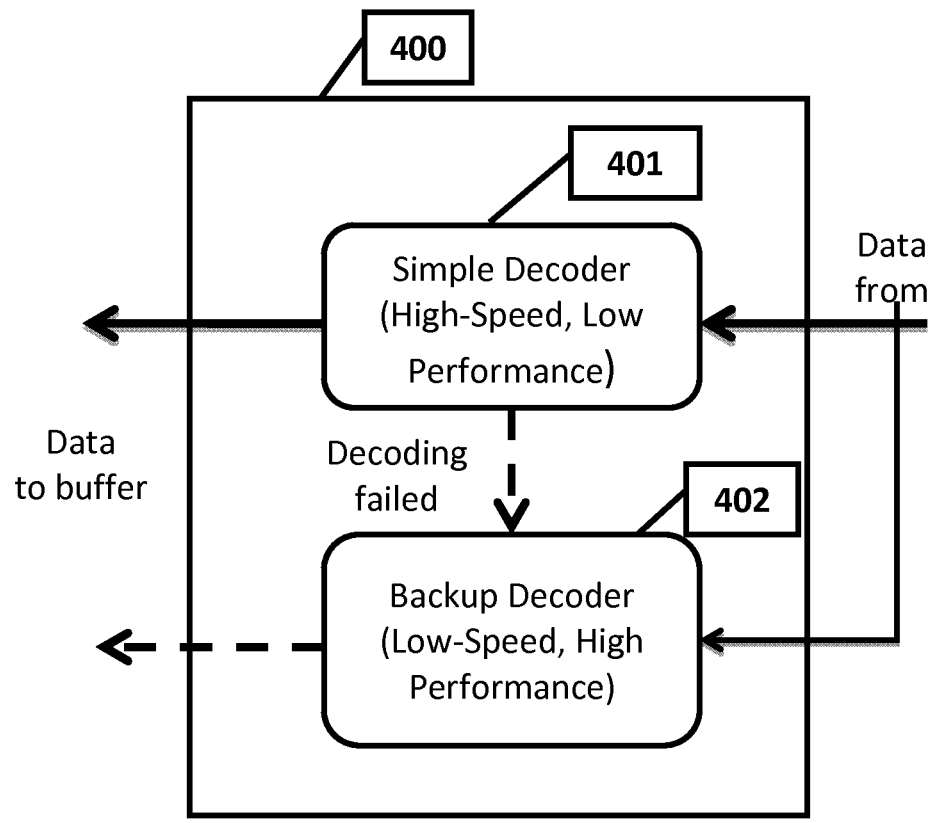
FIG. 4 shows a block diagram of the page decoder 302 in FIG. 3.

FIG. 4 shows a block diagram of the page decoder 302 encapsulating two lower level decoders. The simple decoder 401 will be used first. If the default decoder fails, the backup decoder 402 is used. Both of them take as inputs the noisy values read from the flash, and store their outputs in the buffer 201 for further processing or to be sent to the host.

The proposed approach uses a LDPC (Low Density Parity Check) code for protecting the data. The LDPC code is assumed to be represented as a Tanner graph. The Tanner graph of a LDPC code is a bipartite graph with two types of nodes, known as variable and check nodes, and edges connecting nodes of different types. Each variable node represents one of the bits in the codeword and each check node, a code constraint. In the binary case, the values of the variable nodes connected to each check node must add up to an even number. The encoding is done as explained in [Richardson, Urbanke, 2003].

Most algorithms for decoding LDPC codes can be explained as iterative message passing procedures on the code's Tanner graph: decoder inputs are mapped to variable nodes, which then send messages to check nodes. Each check node collects all the messages received and uses them to generate a reply for each of the variable nodes. Similarly, each variable node uses the replies received, as well as the mapped input, to generate an updated message to be sent back. This process repeats itself for a number of times, after which the decoder returns a hypothesis about the value of each variable node. Unlike algebraic codes, most LDPC decoders can take advantage of soft (i.e., finely discretized) inputs to increase their error correction capability.

NAND Flash memory is capable of reading both the hard-information data (data represented as 0's and 1's), as well as soft-information data. In order to read back the soft information data from NAND Flash, it is necessary to repeat the read of the same page several times but with different read-thresholds. Each read-threshold represents the voltage differential applied to the source and the gate of the floating gate transistor. By changing the value of the read-threshold up and down over a range of values, the read-back value of the floating gate transistor may change from 0 to 1 and vice versa.

The soft-information read-back can then be reconstructed from the set of read-back values of the transistor over the range of read-thresholds, for example by taking the average read value. If all of the reads of the same transistor yielded 1, then the soft information is precisely 1. If 60% of the reads of the same transistor yielded 1 and 40% of the reads yielded 0, then the soft information is 0.6. This is the most widely used method of obtaining the soft information from NAND flash device. Both the soft and hard information is further processed by converting the received values into Log-Likelihood-Ratios (LLR) via look-up tables as described in Provisional U.S. Patent Application 61/467,282, filed Mar. 24, 2011, incorporated herein by reference in its entirety.

Soft-information read allows LDPC decoder to recover the corrupted data more efficiently, however since it requires performing several reads of the same page, it decreases the read speed proportionally. Therefore the hard-information (i.e. conventional) read should be performed most of the time and the soft-information read should be performed only when the hard-information read and LDPC decoding failed. Thus the read process is divided into the following 3 steps:

(1) Read Hard-Information from NAND Flash and use the simple (high-speed and low precision) LDPC decoder to decode the data.

(2) If step (1) failed, use back-up (low speed high-precision) LDPC decoder to decode the data from the Hard-Information and corresponding hard LLR de-map look-up table.

(3) If step (2) failed, perform Soft-Information read from NAND Flash and use back-up (low speed high-precision) LDPC decoder to decode the data based on soft LLR de-map look-up table.

Since almost all of the time step (1) is sufficient to recover the data and steps (2) and (3) are needed in rare cases at the end of the product life, the overall power consumption is reduced.

Figure 5:
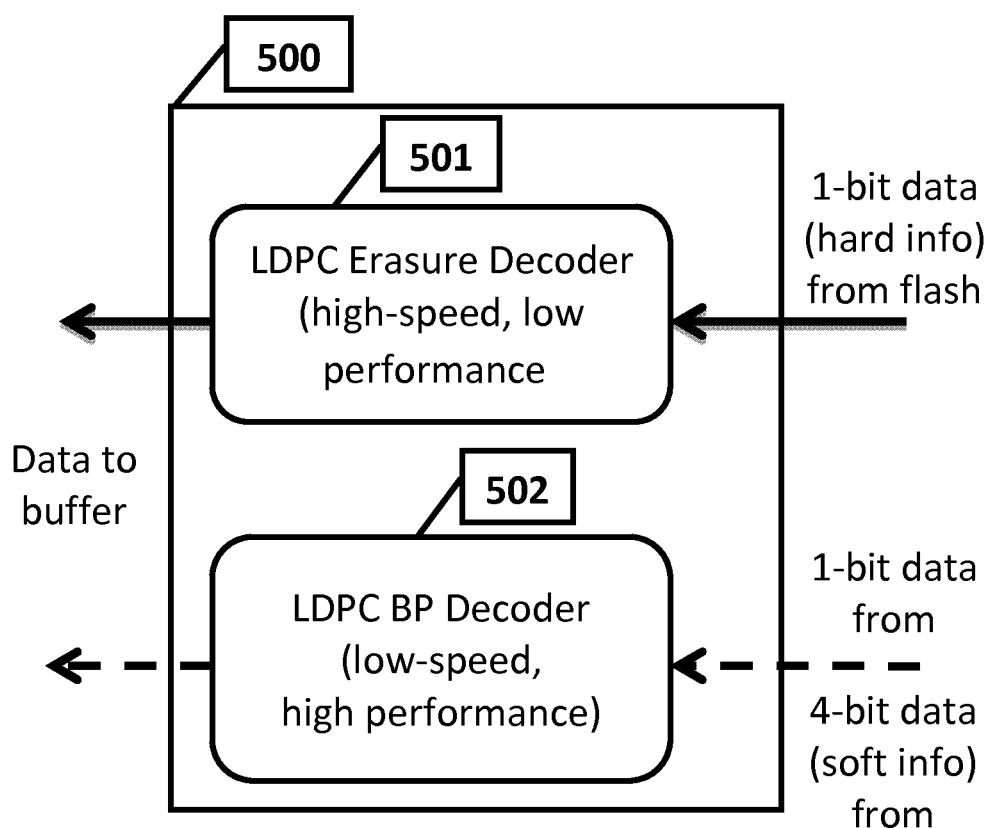
FIG. 5 shows a block diagram of the page decoder 400 of FIG. 4.
Figure 6:
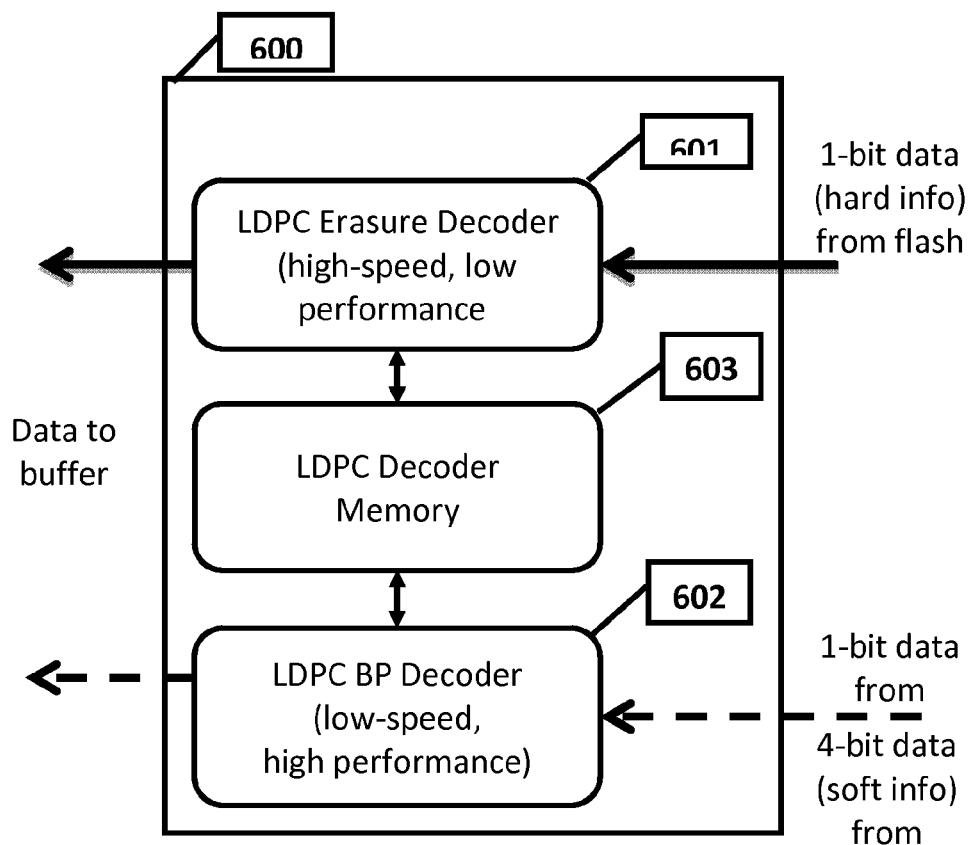
FIG. 6 shows a block diagram of an efficient implementation of the proposed invention as shown in FIG. 5, where the memory is shared between the two decoders.

FIG. 5 shows a block diagram of the page decoder 400 of FIG. 4, where data is encoded with an LDPC code, the simple decoder 401 uses LDPC Erasure decoding algorithm, and the backup decoder 402 uses the min-sum, reduced complexity Belief Propagation decoding algorithm, as described in [Chen, Dholakia, Eleftheriou, Fossrier and Hu, 2005]. FIG. 5 therefore includes the specific algorithms proposed for the simple and backup decoders. The use of the LDPC Erasure Decoding algorithm for the simple decoder is proposed, and its complete description can be found in reference [Mitzemacher, 1998] and [Richardson, Urbanke, 2001]. The Erasure Decoder provides good trade-off between performance and complexity as described in [Richardson, Urbanke, 2001]. The LDPC Erasure decoder 501 uses 1's and 0's as inputs (hard-decision input) and its internal calculation uses the 3-symbol alphabet "4", "erasure or 0" and "1" where "erasure (0)" is used for bits which constraint evaluation is ambiguous and can't reliably assign the sign. The LDPC Erasure Decoder performance is worse compared to Belief Propagation Decoders and it fails more often. When that happens, the hard-decision read information is sent to the min-sum decoder 502 (back-up decoder) which uses 4-bit input LLR precision. According to the density evolution method proposed in [Richardson, Urbanke, 2001] and used as the performance benchmark for the LDPC codes, the 4 bit input precision provides performance very close to theoretical optimum. The efficient implementations of the Min-Sum decoding algorithm can be found in [Hu, Eleftheriou, Arnold, Dholakia, 2001], and [Gunnam, Choi, Yeary]. The two proposed LDPC decoders do not work simultaneously, which allows for the efficient implementation of the overall scheme. The memory needed to store information for the LDPC message passing decoding can be shared by the two decoders as described in FIG. 6.

When the min-sum decoder 502 fails to decode the codeword from the hard-information read, additional data reads are performed so as to obtain the soft-information as described above. After that the soft-information is sent to the min-sum decoder 502 to recover the data.

There is a trade-off between the efficiency of the decoder and the number of additional reads requested. A larger number of reads provides more accurate inputs, and therefore higher error correction capability, but it also introduces additional delays. Therefore the step (3) of the read process can be divided into several sub-steps each corresponding to a different number of soft information reads. An example of such procedure is shown below:

(3a) Perform 2 additional reads to obtain Soft-Information from the 3 total reads of the same page of NAND Flash. Use back-up LDPC decoder (high-precision low speed decoder) to recover the data.

(3b) Perform 2 additional reads to obtain Soft-Information from the 5 total reads of the same page of NAND Flash. Use back-up LDPC decoder (high-precision low speed decoder) to recover the data.

(3c) Perform 10 additional reads to obtain Soft-Information from the 15 total reads of the same page of NAND Flash. Use back-up LDPC decoder (high-precision low speed decoder) to recover the data.

In a practical implementation, the decoder hardware circuitry will need to have a set of registers which govern the specific sequence of sub-steps (3a), (3b), and so on, so as to provide the maximum flexibility in which sequence of steps can be taken based on the overall storage system architecture. Another programmable feature should be the set of registers allowing for the steps (3a), (3b) and so on to include the simultaneous soft-information read of all pages comprising the same word-line, such as reading both the MSB and LSB pages of the same word-line in MLC Flash.

Having thus described a preferred embodiment, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

REFERENCES

T. Richardson and R. Urbanke, "The capacity of low-density parity-check codes under message-passing decoding", IEEE Transactions in Information Theory, vol. 47, pp 0.599-618, 2001;

Thomas J. Richardson and Rüdiger L. Urbanke, "Efficient Encoding of Low-Density Parity-Check Codes," IEEE Transactions in Information Theory, 47(2), February 2001;

M. Mitzenmacher, "A note on low density parity check codes for erasures and errors", SRC Technical Note 1998-017, December 1998;

Jinghu Chen, Ajay Dholakia, Evangelos Eleftheriou, Marc P. C Fossrier and Xiao-Yu Hu "Reduced Complexity Decoding of LDPC Codes", IEEE Transactions on Communications, Vol. 53, No. 8, August 2005;

Xiao-Yu Hu, Eleftheriou, E., Arnold, D.-M., Dholakia, A. "Efficient implementations of the sum-product algorithm for decoding LDPC codes," Global Telecommunications Conference, November 2001;

K. Gunnam, G. Choi, W. Wang, E. Kim, M. Yeary, "Decoding of Quasi-cyclic LDPC Codes Using an On-the-Fly Computation," Signals, Systems and Computers, 2006. ACSSC '06. Fortieth Asilomar Conference on October-November 2006 Page(s):1192-1199

K. Gunnam, G. Choi, M. Yeary, "A Parallel VLSI Architecture for Layered Decoding for Array LDPC Codes," VLSI Design, 2007. 6th International Conference on Embedded Systems, January 2007 Page(s):738-743;

K. Gunnam, C. Gwan, M. Yeary, "An LDPC decoding schedule for memory access reduction," Acoustics, Speech, and Signal Processing, 2004. Proceedings. (ICASSP '04). IEEE International Conference on Volume 5, 17-21 May 2004 Page(s):V-173-6 vol. 5.

What is claimed is:

1. A memory system with error correction, the system comprising:

a flash memory organized into blocks and having a controller that keeps track of Program/Erase (P/E) cycles for each block of the flash memory;

a read/write channel encoder/decoder storing error correction code data;

a read channel decoder comprising of two decoders, high-speed low-precision decoder and low-speed high-precision decoder, wherein the high-speed low-precision decoder is used for low P/E cycles, and the low-speed high-precision decoder is used for high P/E cycles on a block-by-block basis, wherein the high-speed low-precision decoder is an LDPC (Low Density Parity Check) erasure decoder that uses two input symbols and three symbols for internal calculations, and wherein received values from the read/write channel are converted to Log-Likelihood-Ratios (LLR) using lookup tables and based on a number of P/E cycles and based on result of previous reads.

2. The system of claim 1, wherein the high-speed low-precision decoder is a bit-flipping LDPC decoders using Gallager algorithm A or B.

3. The system of claim 1, wherein the low-speed high-precision decoder is a Min-Sum LDPC Decoder.

4. The system of claim 1, wherein the low-speed high-precision decoder is a Belief Propagation Decoder.

5. The system of claim 4, wherein the soft read information is improved by repeated shift reads until successful decoding.

6. The system of claim 1, wherein the low-speed high-precision decoder is an Offset Decoder.

7. The system of claim 1, wherein the low-speed high-precision decoder is a Normalized Min-Sum Decoder.

8. The system of claim 1, wherein the high-speed low-precision decoder and the low-speed high-precision decoder share the memory.

9. The system of claim 1, wherein the read channel decoder performs the following:
   (i) a hard read and erasure decoding;
   if (i) fails, (ii) a hard read followed by hard LLR de-mapping and Min-Sum decoding; and
   if (ii) fails, (iii) a soft read followed by soft LLR de-mapping and Min-Sum decoding.

10. The system of claim 1, wherein the received values are converted to Log-Likelihood-Ratios (LLR) based on elapsed retention time that is determined from the read information.

11. A memory system with error correction, the system comprising:
   a flash memory having row and columns and organized into a plurality of pages, with multiple pages organized into blocks;
   a controller that keeps track of Program/Erase (P/E) cycles for each block and provides stored data bits for each memory cell and a representation of cell voltage used to produce each of the stored data bits;
   a read/write channel encoder/decoder storing error correction code data, the read/write channel encoder/decoder including (a) a high-speed low-precision decoder used for error correction when the cell voltage is not substantially different from a programmed voltage of the memory cell, and (b) a low-speed high-precision decoder used for error correction when the cell voltage is substantially different from the programmed voltage of the memory cell,
   wherein the high-speed low-precision decoder or the low-speed high-precision decoder is used on a block-by-block basis,
   wherein the high-speed low-precision decoder is an LDPC (Low Density Parity Check) erasure decoder that uses two input symbols and three symbols for internal calculations, and
   wherein received values from the read/write channel are converted to Log-Likelihood-Ratios (LLR) using lookup tables and based on a number of P/E cycles and based on result of previous reads.

12. The system of claim 11, wherein the low-speed high-precision decoder is a Min-Sum LDPC Decoder.

13. The system of claim 11, wherein the high-speed low-precision decoder and the low-speed high-precision decoder share the memory.

14. The system of claim 11, wherein the read channel decoder performs the following:
   (i) a hard read and erasure decoding;
   if (i) fails, (ii) a hard read followed by hard LLR de-mapping and Min-Sum decoding; and
   if (ii) fails, (iii) a soft read followed by soft LLR de-mapping and Min-Sum decoding.

15. The system of claim 11, wherein the soft read information is improved by repeated shift reads until successful decoding.

* * * * *